United States Patent [19]
Norris et al.

[11] Patent Number: 5,748,042
[45] Date of Patent: May 5, 1998

[54] METHOD FOR ALTERING A DIFFERENCE FREQUENCY SIGNAL AND AMPLIFIER CIRCUIT THEREOF

[75] Inventors: George B. Norris, Phoenix; Joseph Staudinger, Gilbert; Gary W. Sadowniczak, Phoenix, all of Ariz.

[73] Assignee: Motorola, Inc., Schaumburg, Ill.

[21] Appl. No.: 686,876

[22] Filed: Jul. 26, 1996

[51] Int. Cl.$^6$ .................................................. H03F 1/32
[52] U.S. Cl. ........................... 330/277; 330/149; 330/306
[58] Field of Search .............................. 330/149, 277, 330/306; 375/297; 455/63

[56] References Cited

U.S. PATENT DOCUMENTS

| | | | |
|---|---|---|---|
| 3,818,365 | 6/1974 | Hanson | 330/287 |
| 4,623,849 | 11/1986 | Dalman et al. | 330/287 |
| 4,673,886 | 6/1987 | Bickley et al. | 330/149 X |
| 5,001,776 | 3/1991 | Clark | 455/226 |
| 5,015,706 | 5/1991 | Zushi | 330/277 |
| 5,406,226 | 4/1995 | Cioffi et al. | 330/306 |
| 5,423,074 | 6/1995 | Dent | 455/74 |
| 5,469,087 | 11/1995 | Eatwell | 327/470 |
| 5,471,164 | 11/1995 | Penny | 330/149 |

*Primary Examiner*—James B. Mullins
*Attorney, Agent, or Firm*—Rennie William Dover

[57] ABSTRACT

A method and amplifier circuit (20) for conditioning a signal. The amplifier circuit (20) includes a field effect transistor (22) having a sub-harmonic termination (21) connected to a drain of the field effect transistor (22). In addition, an output impedance termination (24) is connected to the drain of the field effect transistor (22) and an input impedance termination (23) is connected to the gate of the field effect transistor (22). The sub-harmonic termination (21) reduces a non-linear component of an interference signal.

20 Claims, 2 Drawing Sheets

METHOD FOR ALTERING A DIFFERENCE FREQUENCY SIGNAL AND AMPLIFIER CIRCUIT THEREOF

BACKGROUND OF THE INVENTION

The present invention relates, in general, to transmitter circuits and, more particularly, to power amplifiers in transmitter circuits.

Transmitter circuits are used in applications such as cellular telephones, wireless radios, and the like to generate a modulated output signal. A typical transmitter circuit includes a power amplifier coupled to an antenna via a duplex filter. The duplex filter has a receiver portion for receiving electrical signals from the antenna and a transmitter portion for transmitting electrical signals through the antenna. Further, the receiver and transmitter portions filter the electrical signals within frequency bands that are separated from each other. For example, the receiver portion may be tuned to filter electrical signals in the frequency band ranging from 869 megahertz (MHz) to 894 MHz, whereas the transmitter portion may be tuned to filter electrical signals in the frequency band ranging from 824 MHz to 849 MHz. Thus, the frequency bands of the receiver and transmitter portions are separated by a frequency of 20 MHz.

An important design consideration when designing transmitter circuits is that an electrical signal at a frequency below the bandwidth of the transmitter portion may be generated by other wireless products, television and radio broadcasting, etc. This signal is received by the antenna and passes through the duplex filter to the output of the power amplifier. Non-linearities within the power amplifier cause the undesired electrical signal to be upconverted to a higher frequency signal which has frequency components that interfere with those of the receiver portion. This phenomenon is referred to as reverse third order intermodulation distortion. The interfering signal propagates through and is attenuated by the receiver portion of the filter. Once at the receiver portion, this interfering signal tends to desensitize and limit the dynamic range of the receiver portion. One technique for minimizing the effect of the interfering signal is to make the order of the duplex filter large enough to sufficiently attenuate the interfering signal. However, as the filter order increases, insertion loss through the filter also increases. Although this additional loss can be overcome by using a power amplifier that operates at a higher power level, this approach consumes more battery current and reduces the overall time available for signal transmission.

Accordingly, it would be advantageous to have a method and a power amplifier capable of overcoming third order intermodulation distortion without increasing the order of the filter. It would be of further advantage for the power amplifier to be inexpensive to manufacture.

DETAILED DESCRIPTION OF THE DRAWINGS

Generally, the present invention provides a power amplifier and a method for improving third order intermodulation distortion. In particular, the present invention is suitable for improving reverse third order intermodulation distortion. This type of distortion arises from signals which occur in frequencies below the transmit bandwidth and are converted to an interfering signal by non-linearities in the power amplifier. The output voltage signal of a power amplifier is expressed by equation 1 (EQT. 1) as:

$$S_o(t) = A_0 + A_1 S_i(t) + A_2 S_i(t)^2 + A_3 S_i(t)^3 + \ldots \qquad \text{EQT. 1}$$

where:

$S_o(t)$ is the output signal voltage of the power amplifier;

$A_i$, $i=0, 1, 2, 3, \ldots$ are series coefficients describing non-linearities of the power amplifier; and $$S_i(t) = S(f_{transmit}) + S(f_L)$$

where:

$S(f_{transmit})$ is the desired transmit signal; and $S(f_L)$ is the undesired low band frequency signal.

Expanding EQT. 1 yields equation 2 (EQT. 2):

$$f_{interfer} = 2f_{transmit} - f_L = f_{transmit} + (f_{transmit} - f_L) \qquad \text{EQT. 2}$$

where:

$f_{interfer}$ is the frequency of the interference signal.

Thus, the overall amplitude and phase of the interference signal, $f_{interfer}$, can be controlled by controlling the amplitude and phase of the difference frequency signal ($f_{transmit} - f_L$). In other words, a sub-harmonic termination element is connected to the power amplifier, wherein the sub-harmonic termination element alters the characteristics of a difference frequency signal. The altered difference frequency signal reduces the interference signal, $f_{interfer}$. The sub-harmonic termination element is also referred to as a sub-harmonic termination.

Figure 1:
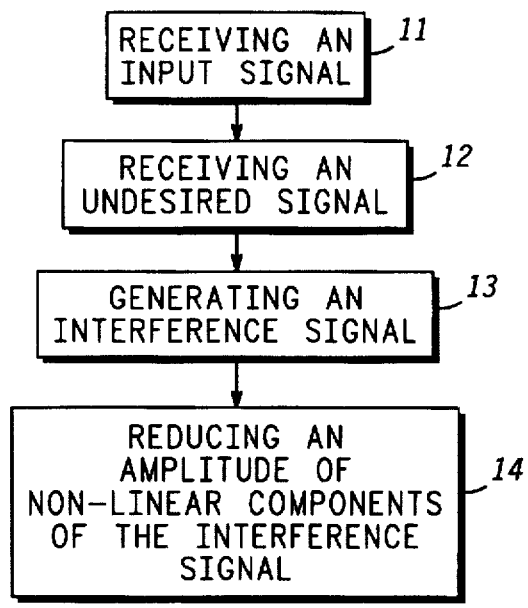
FIG. 1 illustrates a flow diagram of a method for linearizing a power amplifier output signal in accordance with the present invention.

Accordingly, in one aspect of the present invention a method is provided for linearizing the power amplifier output signal by using a sub-harmonic termination to control the amplitude and phase of the difference signal. FIG. 1 illustrates a flow diagram of a method for linearizing the power amplifier output signal. In a first step (indicated by box 11), an input signal of a first frequency is received by the power amplifier. In addition, an undesired low frequency signal of a second frequency is received by the power amplifier (indicated by box 12). The power amplifier generates an interference signal from the undesired low frequency signal and a desired transmit signal (indicated by box 13), wherein the interference signal has frequency components that are the same as those of the input signal. The sub-harmonic termination reduces the amplitude of the constituent components of the interference signal, thereby reducing the overall amplitude of the interference signal (indicated by box 14).

Figure 2:
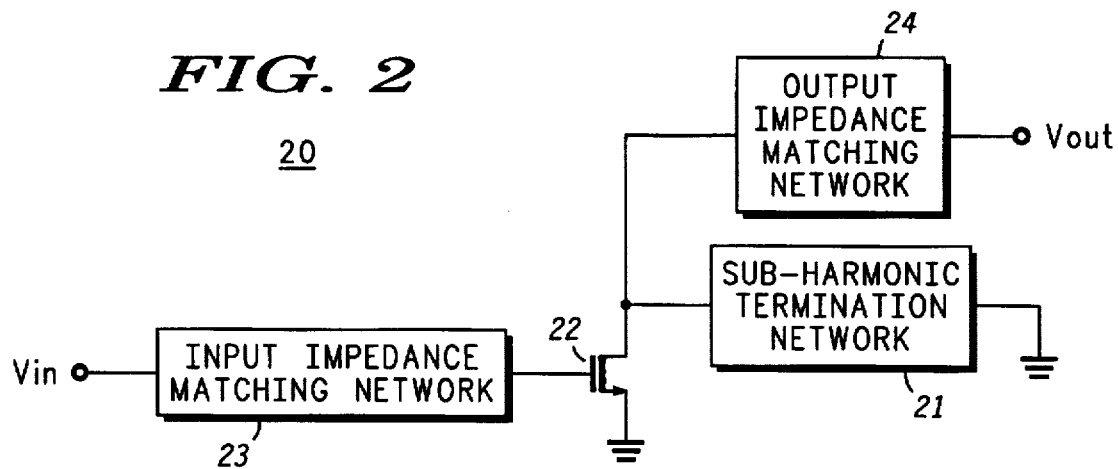
FIG. 2 is a schematic diagram of a power amplifier having a sub-harmonic termination in accordance with a first embodiment of the present invention.

FIG. 2 is a schematic diagram of a power amplifier 20 having a sub-harmonic termination 21 in accordance with a first embodiment of the present invention. Power amplifier 20, also referred to as an amplifier circuit, includes a transconductance amplifier 22. By way of example, transconductance amplifier 22 is a field effect transistor having a drain, a source, and a gate. An input impedance matching network 23 is connected to the gate of transistor 22 and an output impedance matching network 24 is connected to a drain of transistor 22. More particularly, input impedance matching network 23 has an input terminal which serves as the input, $V_{in}$, of power amplifier 20 and an output terminal which is connected to the gate of transistor 22. Similarly, output impedance matching network 24 has an input terminal connected to the drain of transistor 22 and an output terminal which serves as the output terminal, $V_{out}$, of power amplifier 20. The source of transistor 22 is coupled for receiving a power supply voltage or source of operating potential such as, for example, a ground potential. Ground potential is also referred to as ground. Sub-harmonic termination 21 is coupled to the drain of transistor 22.

The impedance of input impedance matching network 23 is set to match the impedance of the transmission line carrying the input signal, thereby preventing reflections from corrupting the input signal. Output impedance matching network 24, on the other hand, transforms a load impedance to a value that provides the desired output power. Input and output impedance matching networks are well known to those skilled in the art. Although power amplifier 20 is shown as having input and output impedance matching networks, 23 and 24, respectively, it should be understood this is not a limitation of the present invention. Either one or both of impedance matching networks 23 and 24 may not be present in power amplifier 20.

It should be noted that the source and drain of transistor 22 serve as current carrying electrodes and the gate serves as a control electrode. Accordingly, transistor 22 is not limited to being a field effect transistor, but can be a bipolar transistor having a collector, an emitter, and a base, wherein the collector and emitter serve as current carrying electrodes and the base serves as a control electrode. Further, transistor 22 can be an N-channel field effect transistor, a P-channel field effect transistor, an NPN bipolar transistor, or a PNP bipolar transistor.

Figure 3:
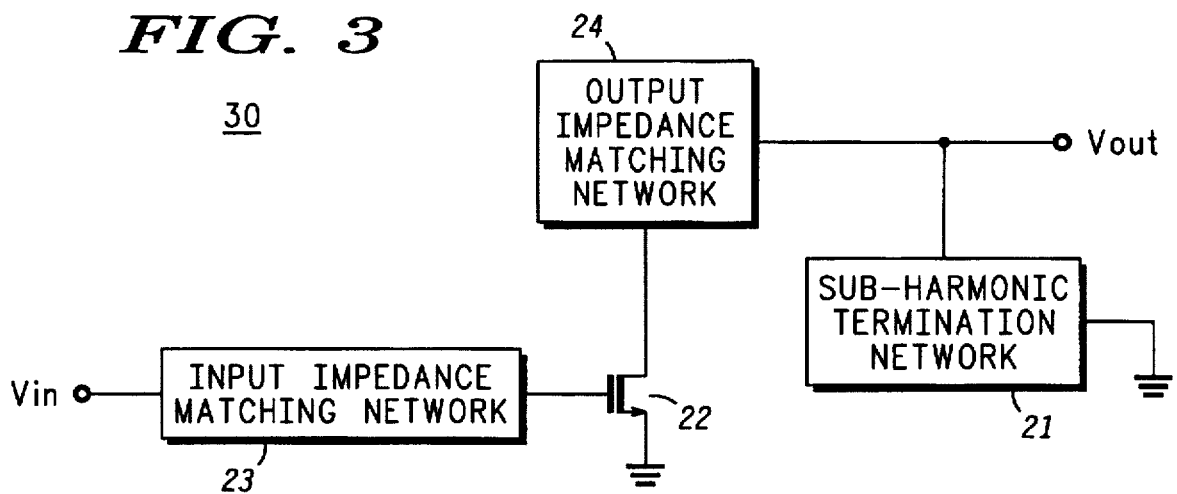
FIG. 3 is a schematic diagram of a power amplifier having a sub-harmonic termination in accordance with a second embodiment of the present invention.

FIG. 3 is a schematic diagram of a power amplifier 30 having a sub-harmonic termination 21 in accordance with a second embodiment of the present invention. It should be understood that the same reference numerals are used in the figures to denote the same elements. Power amplifier 30 includes a field effect transistor 22, input impedance matching network 23, and output impedance matching network 24. It should be noted that the difference between the first embodiment (shown in FIG. 2) and that of the second embodiment (shown in FIG. 3) is the location of sub-harmonic termination 21. In the second embodiment, sub-harmonic termination 21 is connected to the output terminal of output impedance matching network 24.

Figure 4:
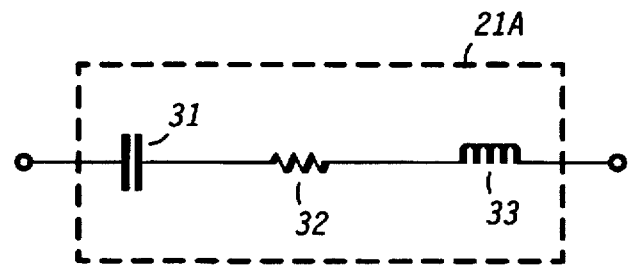
FIG. 4 is a schematic diagram of a first example of a sub-harmonic termination in accordance with the present invention.

FIG. 4 is a schematic diagram of a first example of a sub-harmonic termination 21A in accordance with the present invention. The letter "A" has been appended to the reference number "21" to indicate that the sub-harmonic termination shown in FIG. 4 is one embodiment of sub-harmonic termination 21 shown in FIGS. 2 and 3. Sub-harmonic termination 21A includes a series coupled capacitor-resistor-inductor network comprised of a capacitor 31, a resistor 32, and an inductor 33. More particularly, capacitor 31 is coupled to inductor 33 via resistor 32, wherein one terminal of capacitor 31 serves as an input terminal of sub-harmonic termination 21A. It should be understood that the input terminal of sub-harmonic termination 21A is connected to the drain of transistor 22 in the embodiment shown in FIG. 2 and to the output terminal of output impedance matching network 23 in the embodiment shown in FIG. 3. Further, one terminal of inductor 33 serves as an output terminal of sub-harmonic termination 21A and can be connected to, for example, ground. It should be understood that the order of capacitor 31, resistor 32, and inductor 33 in the series connection is not a limitation of the present invention. For example, resistor 32 can be coupled to capacitor 31 via inductor 33. When the order of the components, i.e., capacitor 31, resistor 32, and inductor 33, is switched, one terminal of the first series connected element serves as the input terminal of sub-harmonic termination 21A and one terminal of the last series connected element serves as the output terminal of sub-harmonic termination 21A. Further, the output terminal of sub-harmonic termination 21A can be coupled to a potential other than ground.

Figure 5:
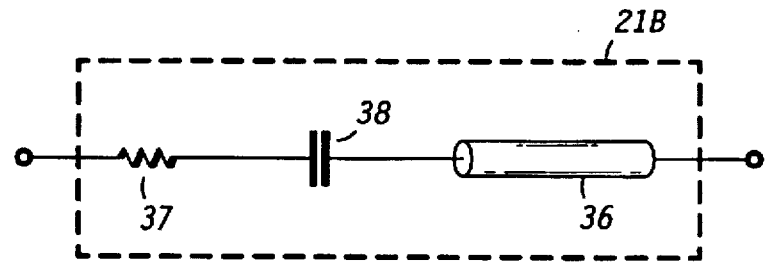
FIG. 5 is a schematic diagram of a second example of a sub-harmonic termination in accordance with the present invention.

FIG. 5 is a schematic diagram of a second example of a sub-harmonic termination in accordance with the present invention. The letter "B" has been appended to the reference number "21" to indicate that the sub-harmonic termination shown in FIG. 5 is another embodiment of sub-harmonic termination 21 shown in FIGS. 2 and 3. Sub-harmonic termination 21B includes a series combination of a transmission line 36, a resistor 37, and a capacitor 38. More particularly, resistor 37 is coupled to transmission line 36 via capacitor 38, wherein one terminal of resistor 37 serves as an input terminal of sub-harmonic termination 21B. It should be understood that the input terminal of sub-harmonic termination 21A is connected to the drain of transistor 22 in the embodiment shown in FIG. 2 and to the output terminal of output impedance matching network 23 in the embodiment shown in FIG. 3. Further, one terminal of transmission line 36 serves as an output terminal of sub-harmonic termination 21B and can be connected to, for example, ground. It should be understood that the order of transmission line 36, resistor 37, and inductor 38 in the series connection is not a limitation of the present invention. Further, the output terminal of sub-harmonic termination 21B can be coupled to a potential other than ground. Although, sub-harmonic termination 21B is shown as including a transmission line 36 coupled to ground via a series coupled resistor-capacitor network, it should be understood this is not a limitation of the present invention. For example, the sub-harmonic termination can be a transmission line without the resistor and capacitor, or it may include a series combination of a transmission line, a resistor, and an inductor, or a series combination of a transmission line and a capacitive element, or combinations thereof.

By now it should be appreciated that a method and apparatus have been provided for reducing reverse third order intermodulation distortion. In accordance with the present invention a sub-harmonic frequency termination is used to reduce the amplitude and phase of a difference signal. An advantage of the present invention is that the sub-harmonic termination reduces the interference signal by generating a non-short circuit condition whereas prior art techniques produce a short circuit condition at the output of the power amplifier. Therefore the prior art techniques have limited success in reducing the amplitude of the interference signal. In addition, the sub-harmonic termination does not require coupling higher order filters to the power amplifier, which filters inherently introduce a greater signal loss. Another advantage of the present invention is that it does not require an increase in the power level of the power amplifier. Thus, the present invention does not decrease the available "talk-time" of a communications device as is typical with prior art techniques.

While specific embodiments of the invention have been shown and described, further modifications and improvements will occur to those skilled in the art. It is understood that this invention is not limited to the particular forms shown and it is intended for the appended claims to cover all modifications of the invention which fall within the true spirit and scope of the invention. For example, the semiconductor power amplifier can include a field effect transistor manufactured using gallium arsenide technology, silicon technology, or the like.

We claim:

1. An amplifier circuit, comprising:

a transistor having first and second current carrying electrodes and a control electrode; and a sub-harmonic termination element having first and second terminals, the first terminal of the sub-harmonic termination element coupled to the first current carrying electrode, wherein the sub-harmonic termination element alters a difference frequency signal between a desired transmitted signal and an undesired low band frequency signal.

2. The amplifier circuit of claim 1, further including an input impedance matching network having first and second terminals, the first terminal coupled or receiving an input signal and the second terminal coupled to the control electrode of the transistor.

3. The amplifier circuit of claim 2, further including an output impedance matching network having first and second terminals, the first terminal coupled to the first current carrying electrode of the transistor and the second terminal serving as an output of the amplifier circuit.

4. The amplifier circuit of claim 1, further including an output impedance matching network having first and second terminals, the first terminal coupled to the first current carrying electrode of the transistor and the second terminal serving as an output of the amplifier circuit.

5. The amplifier circuit of claim 4, wherein the sub-harmonic termination element is coupled to the first current carrying electrode through the output impedance matching network.

6. The amplifier circuit of claim 1, wherein the sub-harmonic termination element comprises a series coupled capacitor-resistor-inductor network.

7. The amplifier circuit of claim 1, wherein the second terminal of the sub-harmonic termination element is coupled for receiving a power supply voltage.

8. The amplifier circuit of claim 7, wherein the power supply voltage is a ground potential.

9. The amplifier circuit of claim 1, wherein the sub-harmonic termination element comprises a transmission line coupled to a power supply voltage via a resistor.

10. The amplifier circuit of claim 1, wherein the sub-harmonic termination element comprises a transmission line coupled to a power supply voltage via a series coupled resistor-capacitor network.

11. The amplifier circuit of claim 1, wherein the sub-harmonic termination element comprises a transmission line coupled to a power supply voltage via a capacitive element.

12. The amplifier circuit of claim 1, wherein the transistor is a gallium arsenide field effect transistor.

13. An amplifier circuit, comprising:

an amplifier circuit having an input and an output; and a sub-harmonic termination element having first and second terminals, the first terminal coupled to the output, wherein the sub-harmonic termination element alters a difference frequency signal between a desired transmitted signal and an undesired low band frequency signal.

14. The amplifier circuit of claim 13, wherein the sub-harmonic termination element includes a series coupled capacitor-resistor-inductor network.

15. The amplifier circuit of claim 13, further including an output matching circuit having first and second terminals, the first terminal coupled to the output of the transconductance amplifier.

16. The amplifier circuit of claim 13, wherein the first terminal of the sub-harmonic termination element is coupled to the output through the output matching network.

17. The amplifier circuit of claim 13, wherein the transconductance amplifier is a field effect transistor.

18. A method for conditioning a signal, comprising the steps of:

receiving an input signal of a first frequency;

receiving an undesired signal of a second frequency;

generating an interference signal from the undesired signal and a transmit signal, wherein the interference signal has a difference frequency signal component; and reducing the amplitude of the difference frequency signal component of the interference signal with a sub-harmonic termination, thereby linearizing the signal.

19. The method of claim 18, wherein the step of reducing an amplitude of the non-linear frequency components of the interference signal includes generating a non-short circuit condition.

20. The method of claim 18, wherein the step of reducing an amplitude of the non-linear frequency components of the interference signal includes controlling a difference signal of the interference signal.

* * * * *